United States Patent [19]
Shirai et al.

[11] Patent Number: 5,463,316
[45] Date of Patent: Oct. 31, 1995

[54] MAGNETOOPTIC SENSOR HEAD

[75] Inventors: Kazushi Shirai; Toshihiro Shinbo; Norio Takeda; Mitsuzo Arii, all of Tokyo, Japan

[73] Assignee: Mitsubishi Gas Chemical Co., Ltd., Tokyo, Japan

[21] Appl. No.: 70,684

[22] Filed: Jun. 2, 1993

[30] Foreign Application Priority Data

Jun. 3, 1992 [JP] Japan .................. 4-142929

[51] Int. Cl.⁶ .................................. G01R 33/02
[52] U.S. Cl. ............... 324/244.1; 359/280; 359/281; 359/282; 359/283; 359/284; 359/500; 359/484
[58] Field of Search .................... 359/500, 280, 359/484, 494, 281, 282, 283, 284; 324/244.1

[56] References Cited

U.S. PATENT DOCUMENTS

| | | | |
|---|---|---|---|
| 4,818,080 | 4/1989 | Glasheen | 350/355 |
| 4,896,103 | 1/1990 | Shimanuki et al. | 324/244.1 X |
| 5,038,102 | 8/1991 | Glasheen | 324/175 |
| 5,186,866 | 2/1993 | Ryuo et al. | 359/280 X |
| 5,212,446 | 5/1983 | Itoh et al. | 359/280 X |

FOREIGN PATENT DOCUMENTS

| | | |
|---|---|---|
| 0208476 | 1/1987 | European Pat. Off. . |
| 0393889 | 10/1990 | European Pat. Off. . |
| 9015613 | 3/1991 | Germany . |
| 56-55811 | 5/1981 | Japan . |
| 0065414 | 4/1983 | Japan . |
| 322595 | 3/1991 | Japan . |

OTHER PUBLICATIONS

"Fiber-Optic Current and Voltage Meters", National Technical Report, vol. 29, No. 5, Oct. 1983.
"Fiber optic tachometer based on the Faraday effect", Applied Optics 1991, vol. 20, No. 11, Jun. 1, 1989.
"Structural Properties of Magnetic Garnet Films", S. Lagomarsino and A. Tucciarone, Electronics & Optics, Thin Solid Films 114 (1984) pp. 45–67.
"Angular dependence of site preference in growth-induced anisotropy", Josephs et al., Journal of of Applied Physics, vol. 51, No. 9, Sep. 1980, pp. 4939–4943.
Svantesson, "Magneto-Optical Garnet Materials in Fibre Optic Sensor Systems for Magnetic Field Sensing," SPIE, vol. 1274, Mar. 1990, pp. 260–269.
Patent Abstracts of Japan, vol. 11, No. 383 (P–646), Dec. 15, 1987 (JP–A–62 150 185, Jul. 1987).

*Primary Examiner*—Kenneth A. Wieder
*Assistant Examiner*—Kourosh Cyrus Khosravi
*Attorney, Agent, or Firm*—Sughrue, Mion, Zinn, Macpeak & Seas; Richard C. Turner; Joseph Bach

[57] ABSTRACT

A reflection type magnetooptic sensor head is disclosed. The respective structural elements are aligned following a light source in the order of a light inputting/outputting path, polarizer, Faraday rotator, and reflecting mirror. The Faraday rotator is made of a (111) bismuth-substituted iron garnet single crystal film having [111] axis at an angle of 5–60 degrees with an axis normal to the film surface. The reflecting mirror is positioned such that a light incident upon the reflecting mirror is substantially normal to the surface of the reflecting mirror.

4 Claims, 4 Drawing Sheets

(EXPANDED)

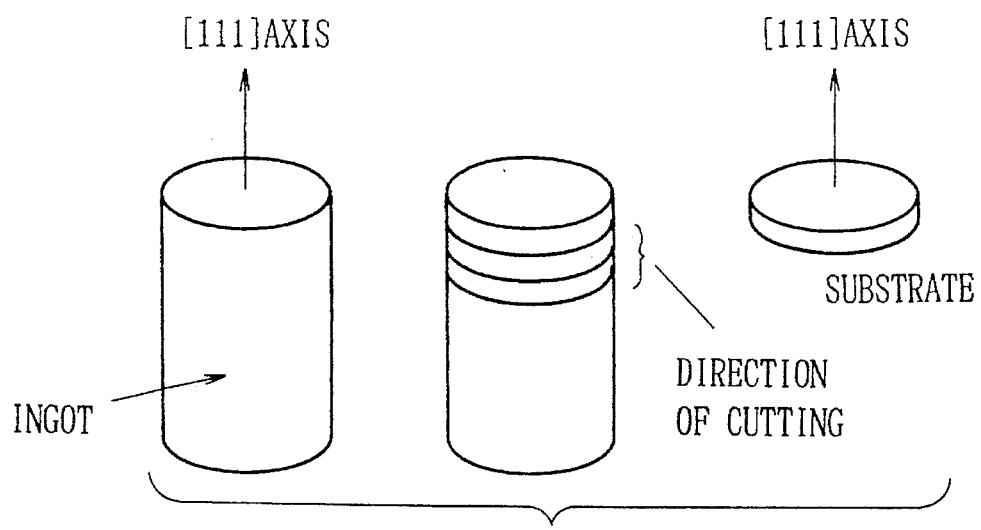
F I G. 7
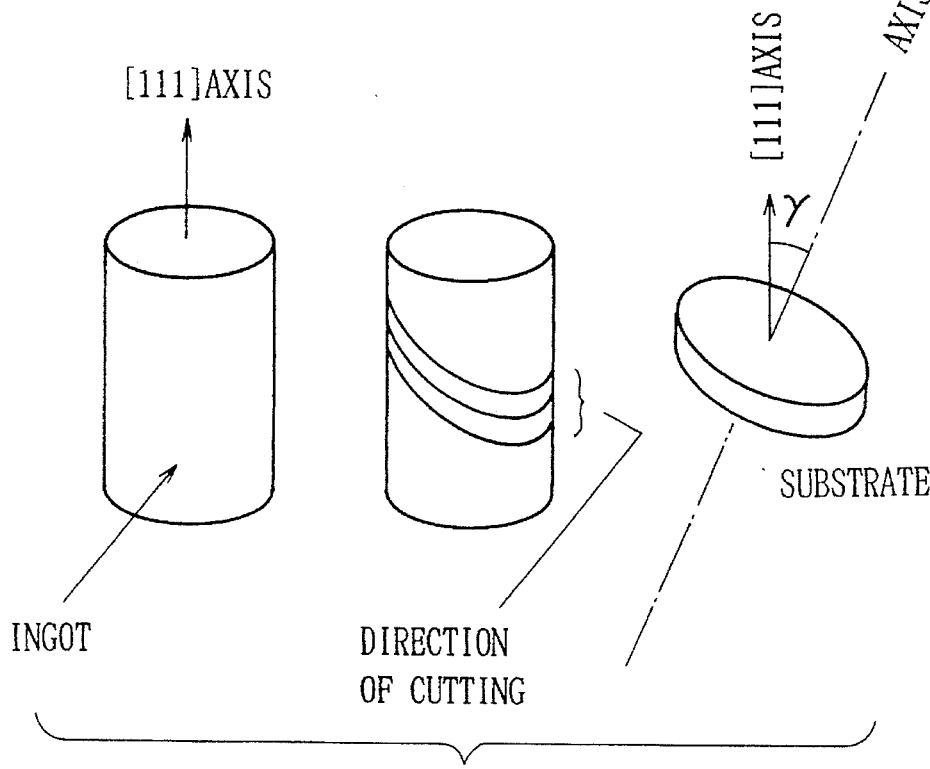
F I G. 8

MAGNETOOPTIC SENSOR HEAD

BACKGROUND OF THE INVENTION

1. Field of the Invention

The present invention relates to a magnetooptic sensor head that uses Faraday effect of a bismuth-substituted iron garnet single crystal film, and more particularly to a reflection type magnetooptic sensor that uses a bismuth-substituted iron garnet single crystal film having a [111] axis at an angle of 5–60 degrees with an axis normal to the film surface.

2. Prior Art

Today, many of conventional industrial apparatuses and consumer equipment include rotating devices or rotating mechanism such as motors and gears. In order to implement accurate control of rotating apparatuses, the rotational speeds thereof must be measured both continuously and accurately. This measurement requires accurate measuring devices which are simple, light weight, and readily available at low costs and in large quantity.

There have been proposed a variety of methods of measuring rotational speeds. One such method makes use of electromagnetic induction (Sensor Gijutsu, page 68, December, 1986). Another uses a magnetooptic sensor based on Faraday effect of magnetooptic materials (Applied Optics, Vol.28, No.11, page 1,992, 1989). The method based on electromagnetic induction has been used in measuring the rotational speeds of engines for aircraft and automotive vehicles. This type of rotational speed meter is susceptible to electromagnetic noise that comes in through the cables connecting the probe and the main body of the tachometer. Furthermore, since electric circuits are involved, this type of rotational speed meter must be designed so that the electric circuits will not cause explosion when used in the environment where flammable materials such as organic solvents are used or stored.

A magnetooptic sensor head based on Faraday effect of a magnetooptic material, makes use of the changes in rotation of polarization plane of the magnetooptic material in response to the presence and absence of a magnetic field (or a magnet) when a permanent magnet (or magnetic field) approaches the magnetooptic material. That is, the rotation of the polarization plane of a light that is transmitted through a magnetooptic material incorporated in a magnetooptic sensor head, is converted into changes in light intensity, and the number of changes is counted to determine the rotational speed (National Technical Report, Vol.29, No.5, p70, (1983)).

Magnetooptic sensor includes the transmission type and the reflection type. With the transmission type, because of the nature of the structural elements, the elements must be aligned in a straight line so that the light travels straightly. Thus, if some obstructions are located in the course of the light, the magnetooptic sensor head cannot be placed properly.

Meanwhile, Japanese Patent Preliminary Publication No.56-55811 discloses a reflection type magnetooptic sensor head which overcomes the deficiencies of the transmission type magnetooptic sensor head. This magnetooptic sensor has an input light path from which a signal light exits into the Faraday rotator, and an output light path into which the signal light exits from the Faraday rotator. These two light paths are aligned side by side on the same side of the Faraday rotator. In other words, the Faraday rotator is mounted at the tip end of the magnetooptic sensor. Thus, a reflection type magnetooptic sensor head is advantageous in that the sensor head can be installed in a narrow space where a transmission type magnetooptic sensor head cannot be installed.

However, the reflection type sensor head of Matsui et al. is disadvantageous in that one lens must be in series with the polarizer, the other lens must be in series with the analyzer, and these two series connections must be in parallel with each other. This requirement of aligning the series connection side by side places limitations on automatic assembly operation of the entire system in production, and is not cost effective.

FIG. 1 shows Japanese Patent Publication No.3-22595 to Matsumura et al. who propose a configuration where the polarizer and the analyzer are replaced by a single polarizer 5. This configuration overcomes the deficiency of the reflection type magnetooptic sensor head proposed by Matsui et al.

In FIG. 1, the light emitted from a light source 1 such as a semiconductor laser, passes through a lens 2 and a half mirror 3. The light then enters an optical fiber 4. The half mirror 3 permits part of the light incident thereupon to pass through and reflects the remaining light. A photodetector 8 or power meter placed in the light path 9 serves to measure variations in the intensity of light emitted from the light source 1. The signal light directed to the optical fiber 4 passes through a lens 2, half mirror 3 into the optical fiber 4. The signal light exiting the optical fiber 4 passes through the polarizer 5 and the Faraday rotator 6 to a reflecting film 7, which is usually made of a metallic thin film.

The signal light is then reflected by the reflecting film 7 back to the Faraday rotator 6 and then to the polarizer 5. The returning light through the polarizer 5 enters the optical fiber 4. The returning light exiting the optical fiber 4 enters the half mirror 3 which reflects in part the light into the light path 9. The light passing through the light path 9 then enters the photodetector 8 which measures the intensity of the signal light.

Matsumura et al. employed yttrium iron garnet ($Y_3Fe_5O_{12}$), usually referred to as YIG, as a Faraday rotator produced by flux melt technique. YIG is advantageous as a Faraday rotator element in that Faraday rotation coefficient-(deg/cm) is larger in YIG than in paramagnetic glass and zinc selenide. The use of YIG proposed by Matsumura et al. is one way of overcoming the deficiency of a reflection type magnetooptic sensor head proposed by Matsui et al.

In fact, the use of YIG is of great interest as a Faraday rotator element. However, YIG may not be practical as a Faraday rotator since it is well known that YIG transmits lights in near infrared rays having wavelengths longer than 1.1 µm and absorbs lights in 0.8 µm band.

Conventionally, an optical sensor head uses a light source such as semiconductor laser (LD) or light emitting diodes (LED). These light sources have median wavelengths in the range of 0.78–0.85 µm. Semiconductor laser and light emitting diodes are used as a light source for an optical sensor because they are very inexpensive in the above wavelength range as well as photodetectors have good sensitivity in that range. Using light sources available on the market is most preferred and is the best way to provide inexpensive magnetooptic sensor heads in order to meet the User's needs.

High light absorption of YIG in the 0.8 µm band implies that the detection of light may be difficult if a light source available on the market is used. That is, YIG is inherently deficient as a Faraday rotator.

The inventors of the present invention investigated many other materials in order to overcome the deficiency of YIG. The inventors concluded that bismuth-substituted iron garnets could be used as a magnetooptic material. The bismuth-substituted iron garnets can be manufactured rather easily by LPE (Liquid Phase Epitaxial) method, and lends itself to mass production. Bismuth-substituted iron garnets are represented by a chemical formula $(RBi)_3(FeA)_5O_{12}$, where R represents yttrium Y or rare earth elements and A represents aluminum Al and gallium Ga.

The Faraday rotation coefficient of a bismuth-substituted iron garnet, i.e., the rotation angle of the polarization plane per unit film thickness at saturated magnetization is as large as several times that of YIG, and more specifically about ten times at 0.8 μm band. This indicates that the film thickness can be smaller with increasing Faraday rotation coefficient for the same magnetooptic effect, achieving less light absorption loss and smaller size. The film thickness of an element can be smaller in bismuth-substituted iron garnets than in YIG, indicating less light absorption. Thus, bismuth-substituted iron garnets are useful in implementing an magnetooptic sensor head with a light source having a wavelength of 0.8 μm band.

The magnetic saturation of bismuth-substituted iron garnets ranges from 500 to 1200 Oe which are about half that of YIG (about 1800 Oe). This indicates that the bismuth-substituted iron garnets can be used to measure weak magnetic fields as well. The ability to measure weak magnetic fields implies that the absence and presence of the magnetic field can be detected even if the magnetooptic sensor head is located far away from a magnet. This provides more flexibility and higher degrees of freedom in installing the magnetooptic sensor head and suggests wider fields of application for magnetooptic sensor heads.

With the aforementioned investigation, the inventors of the present invention believed that reflection type magnetooptic sensor heads can be developed by the use of a bismuth-substituted iron garnet as a Faraday rotator. Based on the disclosure in Japanese Patent Publication No.3-22595, the inventors of the present invention built an engineering model of a reflection type magnetooptic sensor head as shown in FIG. 1 using a Faraday rotator made of a bismuth-substituted iron garnet single crystal in place of YIG.

Then, using the thus built reflection type magnetooptic sensor head, the inventors made a variety of experiments for various magnetic field intensities. However, the sensor head failed to detect any light signal regardless of whether the sensor head is applied with a magnetic field.

Therefore, the inventors made further various experiments in order to find out the reason why the reflection type magnetooptic sensor head according to FIG. 1 failed to detect the light signals. Having made great many experiments, the inventors finally realized that the sensor head failed to detect light due to the magnetic domain structure of the Faraday rotator. The inventors realized that a reflection type magnetooptic sensor head of the construction in FIG. 1 cannot detect light signals if the Faraday rotator is-made of a multidomain element such as bismuth-substituted iron garnets, which have a number of magnetic domains.

The result obtained by the inventors of the present invention do not agree to the experimental results obtained by Matsumura et al. who used YIG as a Faraday rotator which also has multidomain structure as in a bismuth-substituted iron garnet. The bismuth-substituted iron garnet with multidomain did not properly function as a Faraday rotator in the reflection type magnetooptic sensor head built according to the construction of FIG. 1, similar to the YIG in Japanese Patent Publication No.3-22595, while a YIG having the same multidomain functioned properly as a Faraday rotator in Japanese Patent Publication No. 3-22595.

Having reviewed the aforementioned experimental results and making further basic experiments, the inventors confirmed that a reflection type magnetooptic sensor head can be constructed of a reflecting film, (111) bismuth-substituted iron garnet single crystal, polarizer, and light-inputting/outputting paths. Further, the light-inputting/outputting paths are divided into two light paths; an incoming-light path for the light coming into the polarizer from a light source and an outgoing light path for the light leaving the polarizer back to the light source. The two light paths are aligned such that they make an angle greater than 5 degrees with respect to each other. The inventors further continued the research work of magnetooptic sensor heads, and then developed a reflection type magnetooptic sensor head using a Faraday rotator made of a bismuth-substituted iron garnet as disclosed in Japanese Patent Application No.4-90976 (filed on Apr. 10, 1992.).

FIG. 2 shows the construction of a reflection type magnetooptic sensor head disclosed in Japanese Patent Application No. 4-90976. In FIG. 2, a polarizer is depicted at 10. A Faraday rotator 11 is made of a (111) bismuth-substituted iron garnet single crystal film which is magnetized most easily in a direction normal to the film surface. The Faraday rotator 11 is exposed to a magnetic field to be measured. A reflecting film 12 reflects the incident light. An optical waveguide 13 for incoming lights is formed on glass or polymer, or is in the form of an optical fiber. An optical waveguide 14 for outgoing lights is formed on glass or polymer, or is in the form of an optical fiber.

In FIG. 2, the light emitted from a light source 16 such as a semiconductor laser, is directed through a lens 15 into the incoming light path iS. The incoming light path 13 may be directly connected with the light source 16 by omitting the lens 15. The light exiting the light path 13 then passes through the polarizer 10, the Faraday rotator 11 to incident upon the reflecting film 12. The light is then reflected by the reflecting film 12 back through the Faraday rotator 11, the polarizer 10, the light path 14 to enter a photodetector 17 which detects the light as a light signal. With the reflection type magnetooptic sensor head in FIG. 2, the light inputting/outputting port has two independent paths 13 and 14 which make an angle α greater than 5 degrees relative to each other.

The aforementioned reflection type magnetooptic sensors head using a Faraday rotator made of a bismuth-substituted iron garnet, adequately meet the requirements for a magnetooptic sensor head. However, they still need further many technical improvements. For example, the two light paths must be aligned such that they make an angle α greater than 5 degrees with respect to each other (Japanese Patent Application No.4-90976), the Faraday rotator must be arranged such that the Faraday rotator is at an angle with an axis normal to the polarizer and reflecting mirror (Japanese Patent Application No.4-116141, filed on May 8, 1992), and the sensor head must be in a unitary construction such that the (111) bismuth-substituted iron garnet single crystal film is sandwiched between slanting surfaces of two rectangular prism (Japanese Patent Application No.4-130674, filed on May 22, 1992). This construction is disadvantageous in implementing a sensor probe having a diameter less than 5 millimeters. Thus, the sensor is not useable for measuring a magnetic field in a very narrow space such as a cylinder provided in the rotating shafts of gyros or turbines where the diameters are on the order of several millimeters. The Faraday rotator is usually cut from an ingot such that [111] axis is normal to the surface of the Faraday rotator as shown in FIG. 7.

SUMMARY OF THE INVENTION

As mentioned above, the inventors have successfully developed a reflection type magnetooptic sensor based on a (111) bismuth-substituted iron garnet single crystal film as a Faraday rotator. The reflection type magnetooptic sensor that is easy to assemble and align is implemented by the use of a bismuth-substituted iron garnet crystal film having a [111] axis at an angle γ of 5 to 60 degrees with an axis normal to the film surface. The present invention is a magnetooptic measuring apparatus where a light inputting/outputting path, polarizer, (111) bismuth-substituted iron garnet single crystal film (Faraday rotator), reflecting film (or mirror) are aligned in this order, and the Faraday rotator is made of a bismuth-substituted iron garnet single crystal film having a [111] axis at an angle γ of 5–60 degrees, preferably 10–45 degrees, with an axis normal to the film surface. The reflecting mirror is positioned such that a light incident upon the reflecting mirror is substantially normal to the reflecting surface thereof.

The present invention commercially provides a very cheap, small size, light weight, easy-to-manufacture reflection type magnetooptic sensor head based on magnetooptic materials having a multidomain structure.

BRIEF DESCRIPTION OF THE DRAWINGS

Features and other objects of the invention will become more apparent from the description of the preferred embodiments with reference to the accompanying drawings in which:

FIG. 7 shows a Faraday rotator which is cut from an ingot such that [111] axis is normal to the surface of the Faraday rotator; and FIG. 8 shows the substrate according to the present invention which is cut from an ingot such that [111] axis is at an angle γ with an axis normal to the film surface.

DETAILED DESCRIPTION OF THE EMBODIMENTS

Figure 3:
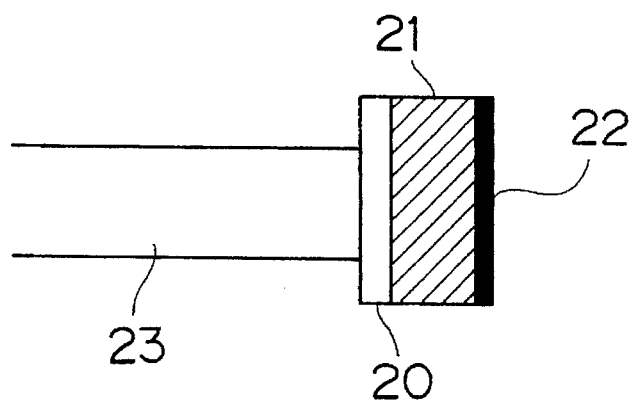
FIG. 3 is an illustrative diagram showing a basic construction of a reflection type magnetooptic sensor according to the present invention.

The present invention will now be described in detail by way of specific examples as follows:

As shown in FIG. 3, a reflection type magnetooptic sensor of the invention based on a Faraday rotator made of a bismuth-substituted iron garnet, is constructed of and aligned after a light source in the order of a light inputting/outputting path 23, polarizer 20, particular (111) bismuth-substituted iron garnet single crystal film (Faraday rotator) 21, and reflecting film 22.

Figure 4:
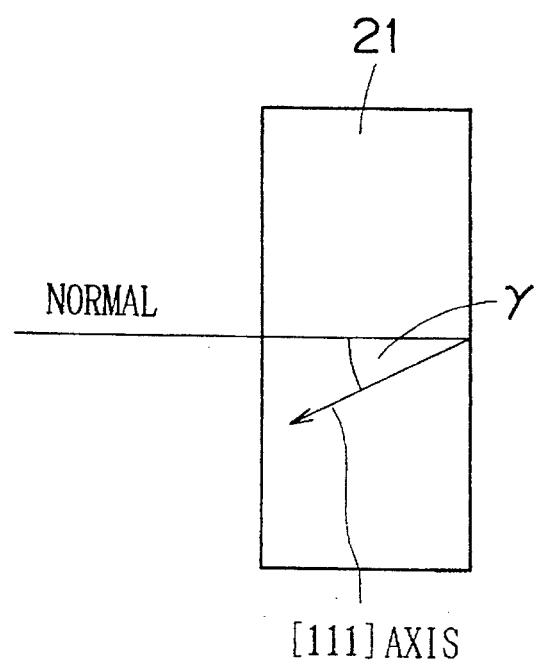
FIG. 4 shows an angular relation between [111] direction of a bismuth-substituted iron garnet single crystal film having an inclined [111] direction and an axis normal to the film surface.

The Faraday rotator or specific bismuth-substituted iron garnet single crystal film of the invention is shown in FIG. 4, and is a particular single crystal whose [111] axis is at an angle ranging from 5 to 60 degrees with an axis normal to the film surface.

In FIG. 3, a polarizer 20 is in the form of, for example, POLARCORE. A Faraday rotator 21 is made of a specific bismuth-substituted iron garnet single crystal film. A reflecting film 22 is made of, for example, a metal thin film and a light inputting/outputting path 23 is in the form of, for example, optical fiber or optical wave guide. For miniaturization of a reflection type magnetooptic sensor, the light inputting/outputting path 23 may be arranged to serve as a light path for an incoming light while also serving as an optimal branching circuit for guiding a light reflected by the reflecting film 22 to a photodetector.

Figure 5:
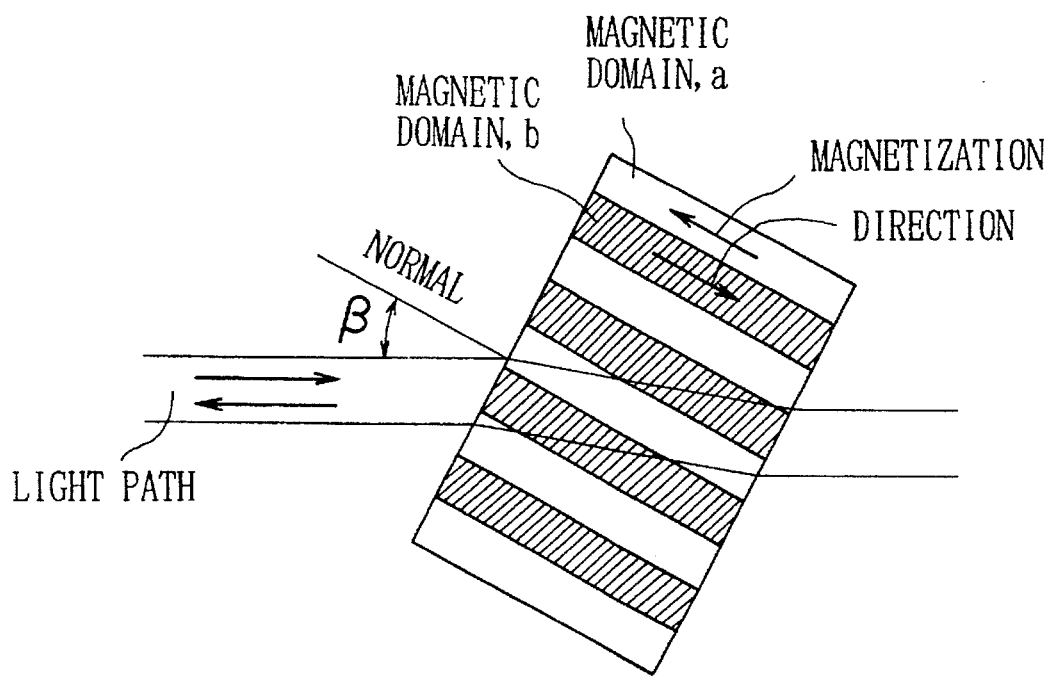
FIG. 5 shows the relation among an axis normal to the film surface, and magnetic domains when a Faraday rotator made of a bismuth-substituted iron garnet single crystal film is positioned such that the film surfaces is at an angle with a light incident upon the film surface.

As mentioned above, with a reflection type magnetooptic sensor based on a Faraday rotator made of a bismuth-substituted iron garnet single crystal film having a multidomain structure, it is required that the signal light passes through a plurality of different magnetic domains, i.e., magnetic domains a and magnetic domains b of the Faraday rotator as shown in FIG. 5, while the light emitted from the light input-output path is transmitted through the polarizer, bismuth-substituted iron garnet single crystal to the reflecting film, and is then reflected by the reflecting film back through the bismuth-substituted iron garnet single crystal film into the light inputting/outputting path (refer to FIG. 5 of the present application, Japanese Patent Applications No.4-90976, No.4-116141, and No.4-130674)

Figure 6:
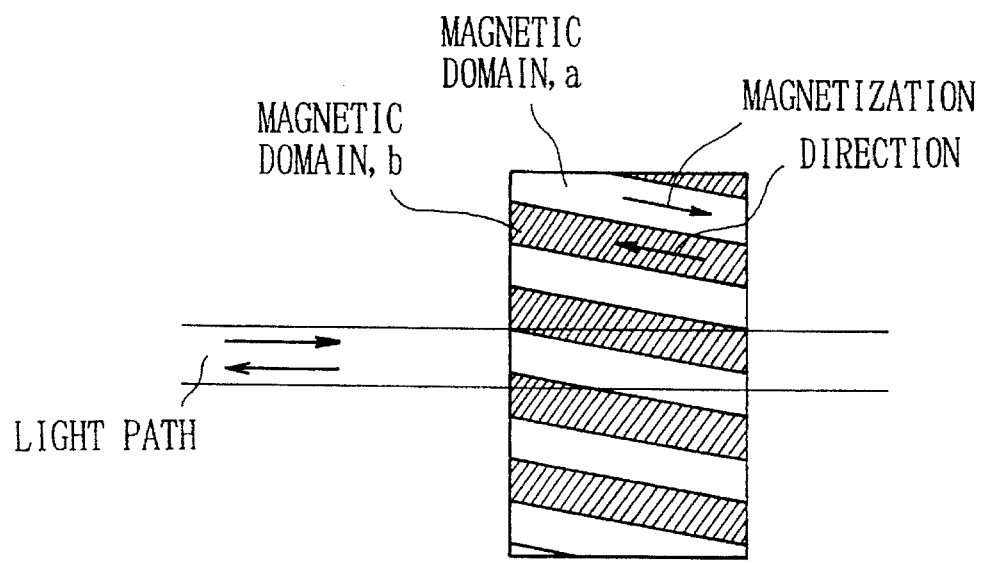
FIG. 6 shows the relation between the locations of magnetic domains of a Faraday rotator made of a bismuth-substituted iron garnet single crystal having an inclined [111] direction and a light incident upon the film surface.

In the present invention, a Faraday rotator made of a (111) bismuth-substituted iron garnet single crystal film having a multidomain structure is used so that the light emitted from the light inputting/outputting path passes through a plurality of different magnetic domains a and magnetic domains b (refer to FIG. 6).

That is, the Faraday rotator has an easy axis, i.e., the direction in which Faraday rotator is easily magnetized, at a predetermined angle γ with an axis normal to the film surface.

In detecting a magnetic field using a magnetooptic sensor, the accuracy of measurement can be affected by the variations in intensity of the light source and the light reflected back by reflective surfaces other than the reflecting film. These reflective surfaces include the surface of the polarizer and the surface of the bismuth-substituted iron garnet single crystal film. Thus, it is necessary to take these variations into account in order to obtain accurate measurement. It is required that the difference ΔP in intensity between light signals should be at least 2 dB between when the sensor head is not applied with a magnetic field and when the sensor is substantially magnetically saturated.

When the optical axis of an incident light is normal to the surface of a (111) bismuth-substituted iron garnet single crystal film having a [111] axis at an angle γ with an axis normal to the film surface, the difference ΔP in intensity of signal lights exceeds 2 dB for γ>5 degrees and becomes greater than 2 dB for greater values of The greater the γ, the better the sensitivity of a magnetooptic sensor. However, too large an angle causes various problems in growing a bismuth-substituted iron garnet single crystal.

Conventionally, a bismuth-substituted iron garnet single crystal is manufactured by LPE method using a non-magnetic garnet substrate (Thin Solid Films, Vol. 114, p35(1984)).

It is well known that growing a bismuth-substituted iron garnet single crystal film by LPE method on a non-magnetic garnet substrate having a [111] axis at an angle with an axis normal to the film surface will result in a bismuth-substituted 1ton garnet single crystal film having the same tilted [111] axis as the non-magnetic garnet substrate, while at the same time an easy axis is also tilted as much as or more than the [111] axis (Journal Applied Physics, vol. 51, p4959(1980)).

In order to obtain a (111) bismuth-substituted 1ton garnet single crystal film having a [111] axis at an angle γ with an axis normal to the film surface, i.e., to have an easy axis tilted by an angle γ from an axis normal to the film surface, a non-magnetic substrate whose [111] axis is at an angle γ with an axis normal to the film surface must be used.

A $(CaGd)_3(ZrMgGa)_5O_{12}$ substrate is one of non-magnetic garnet substrates and is manufactured by Czochralski method. Conventionally, non-magnetic garnet substrates have the least crystal defects in [111] direction (Thin Solid Films, Vol.114, p59(1984). Thus, in order to manufacture a non-magnetic garnet substrate having [111] axis at an angle γ with an axis normal to the substrate surface, the substrate has to be cut from the ingot such that [111] axis is at an angle γ with an axis normal to the film surface as shown in FIG. 8. Thus, the greater the angle γ, the less number of substrates manufactured from the ingot. This increases the cost of the substrate.

Although any conventional polarizer can be used in the invention, a dichroic polarizer is preferred for its small thickness and high extinction ratio.

When manufacturing a magnetic sensor head according to the present invention, there is no particular restriction on the compound of a bismuth-substituted iron garnet. However, it is preferable to select from iron garnet single crystals given by a general equation:

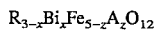

$$R_{3-x}Bi_xFe_{5-z}A_zO_{12}$$

where R is at least one of Y, La, Ce, Pr, Nd, Sm, Eu, Gd, Tb, Dy, Ho, Er, Tm, Yb, and Lu, and A is at least one of Ga, Sc, Al, and In, and $0.3 \leq x \leq 2.0$ and $0 \leq z \leq 1.0$.

A bismuth-substituted iron garnet single crystal of the invention can easily be manufactured by using different substrates by LPE method (Thin Solid Films, Vol.114, p33(1984)). The non-magnetic garnet substrate used in the present invention is manufactured by putting an ingot manufactured by Czochralski method such that the aforementioned desired angle γ is obtained, or putting a non-magnetic garnet $[(GdCa)_3(GaMgZr)_5O_{12}]$ referred to as an SGGG substrate which has a lattice constant of 12.490–12.515 angstroms and is available as a substrate for LPE on the market. In the present invention, the angle γ is selected in the range from 5–60 degrees, preferably from 10–45.

The non-magnetic substrate on which a bismuth-substituted iron garnet thin film is formed, need not be removed. The non-magnetic substrate may be preferably left as a support to enhance mechanical strength if the thin film of a bismuth-substituted iron garnet single crystal film is as thin as several tens of microns. On the other hand, the non-magnetic substrate may be eliminated by grinding for smaller size of the sensor if the film is as thick as several hundreds of microns.

There is no particular requirement for the reflection film. It is preferred to use a mirror made of a metal film deposited on glass available on the market, a bismuth-substituted iron garnet film, metallic mirror made by depositing gold or aluminum directly on a non-magnetic substrate, or dielectric multilayer mirror made or multilayer of metal oxides such as $SiO_2$ and $TiO_2$. The reflection film may be provided either on the side of the bismuth-substituted iron garnet single crystal film or on the side of the substrate.

The light inputting/outputting do not have to be of a special type. The light inputting path may be an optical fiber and the light outputting path may be air but optical wave guides patterned in glass or polymer film, but optical fibers are particularly preferred for mass production and small size of sensors.

Any type of optical fiber may be used for the light paths but, those having core diameters less than 50 μm causes the width of magnetic domain of a bismuth-substituted iron garnet to affect the characteristics of a sensor, resulting in unstable sensitivity and lower optical coupling efficiency. Diameters greater than 50 μm are sufficient.

Figure 1:
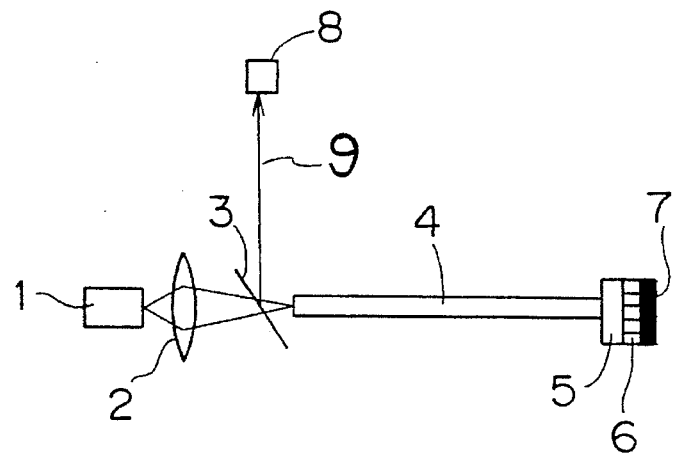
FIG. 1 is an illustrative diagram showing a general construction of a reflection type magnetooptic sensor disclosed in Japanese Patent Publication No. 3-22595.
Figure 2:
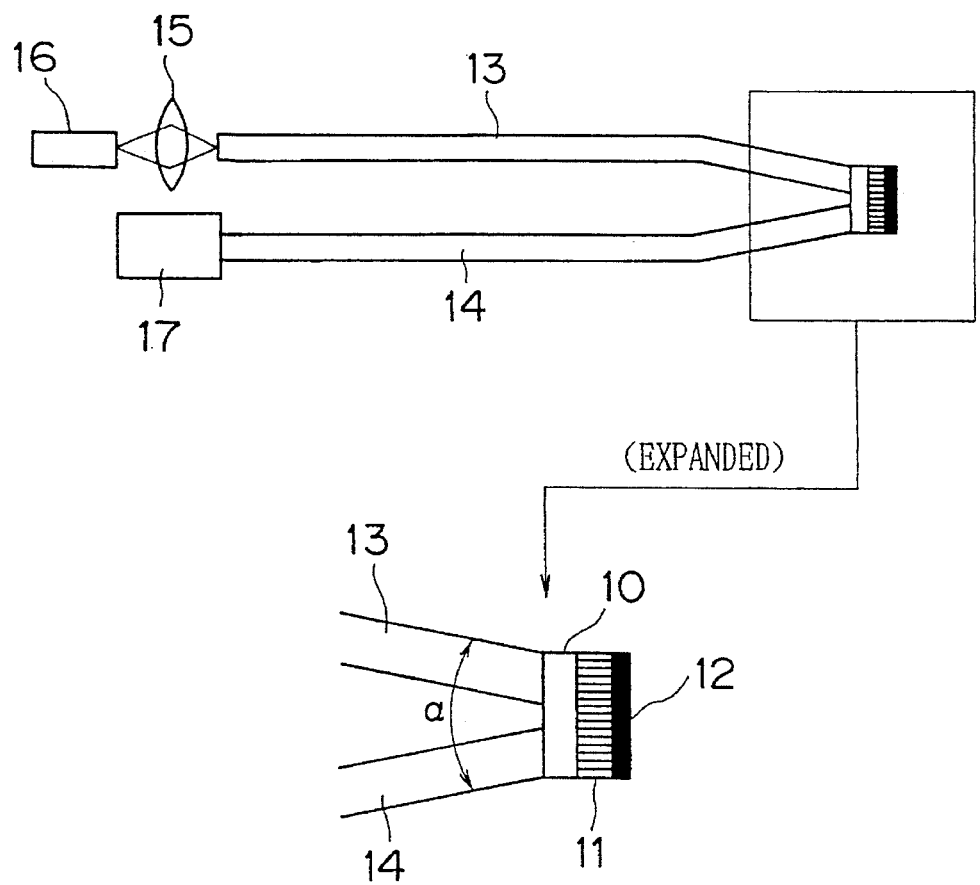
FIG. 2 is an illustrative diagram showing a general construction of a reflection type magnetooptic sensor disclosed in Japanese Patent Application No.4-90976.

The reflection type magnetooptic sensor head according to the present invention is connected to a light source and a photodetector through the use of a half mirror shown in FIG. 1 and an optical branching device such as optical wave guides and optical couplers.

The wavelength of a light source of a magnetooptic measuring apparatus is selected taking into account the sensitivity and light transmittance of a Faraday rotator, the performance and cost of a light source, and the sensitivity of a detector. The wavelength of a light source is preferably selected from a near infrared light in the range from 780 to 850 nm for the following reasons.

(1) A bismuth-substituted iron garnet includes regions called "window" where optical absorption coefficient is relatively small.

(2) The Faraday effect of a bismuth-substituted iron garnet is large.

(3) A bismuth-substituted iron garnet has film thickness from 30 to 100 μm and is easy to manufacture.

(4) Short wavelength semiconductor lasers and light emitting diodes of high output are commercially available at low costs.

(5) The photodetector is highly sensitive and is available at low costs.

Preferable second alternative wavelengths are in the 1300 nm band and 1550 nm band used in optical fiber communications, or 1060 nm at which YAG lasers can be used.

Wavelengths beyond these ranges results in higher optical absorption and smaller Faraday effect of a bismuth-substituted iron garnet, necessitating the thicker film of a Faraday rotator which in turn makes it difficult to manufacture a Faraday rotator by LPE method.

EXAMPLE 1

FIG. 3 shows a general construction of a first embodiment of the invention. According to a conventional method, a one-inch garnet single crystal $[(GdCa)_3(GaMgZr)_5O_{12}]$, which is an ingot having a lattice constant equal to 12.498±0.002 angstroms, was out in such a way that [111]

axis of the ingot makes an angle of 5 degrees with an axis normal to the surface of the single crystal film. A crystal film obtained is a (111) garnet single crystal [(GdCa)$_3$(GaMgZr)$_5$O$_{12}$] of a 500 μm thickness.

The magnetooptic sensor head was manufactured in the following manner.

A 500 milliliter platinum crucible was placed on an LPE furnace, which platinum crucible contained therein a lead oxide (PbO, 4N) of 843 grams, a bismuth oxide (Bi$_2$O$_3$, 4N) of 978 grams, a ferric oxide (Fe$_2$O$_3$, 4N) of 128 grams, a boron oxide (B$_2$O$_3$, 5N) of 38 grams, a terbium oxide (Tb$_4$O$_7$, 3N) of 4.0 grams, and a holmium oxide (Ho$_2$O$_3$, 3N) of 9.0 grams. The content of the crucible was heated to a temperature of 1000 degrees so that the content in the crucible melts. The melted content was sufficiently beaten for a homogeneous mixture and was then cooled down to a melt temperature of 768 degrees to produce a melt for growing a bismuth-substituted iron garnet single crystal.

Then, using a known procedure, a (111) substrate of a garnet single crystal was positioned with one of the two opposed sides thereof being in contact with the thus produced melt for 2.5 hours for epitaxial growth while maintaining the melt temperature at 768 degrees.. A crystal obtained was a (111) bismuth-substituted iron garnet single crystal having a compound of Ho$_{1.1}$Tb$_{0.6}$Bi$_{1.3}$Fe$_5$O$_{12}$ [(HoT-bBiIG) single crystal] and having a film thickness of 51 μm. This crystal showed a Faraday rotation Θ$_F$ of 47.7 degrees at a wavelength 786 nm with saturated magnetization.

Then, aluminum was deposited by vacuum evaporation on the surface of the substrate remote from the epitaxially grown side, thereby forming a reflecting film 22 or mirror. Then, using a conventional method, the side of (HoTbBiIG) single crystal was applied with an antireflection film. This substrate was then cut into Faraday rotator/reflecting film blocks having a size of 2.5 mm by 2.5 mm as shown in FIG. 3.

Using an epoxy type adhesive, a polarizer 20 (trade name is POLARCORE manufactured by CORNING) applied with an antireflection film was securely attached to the single crystal side of the Faraday rotator/reflecting film block. After the adhesive has cured completely, a polymer clad optical fiber of a core diameter of 400 μm was attached as a light inputting/outputting path to the polarizer, thus completing the assembly of a magnetooptic sensor head. The signal light is incident upon the Faraday rotator such that the light exiting the Faraday rotator is normal to the reflecting surface of the reflecting film.

This magnetooptic sensor head (FIG. 3) was used in place of the magnetooptic sensor head of the reflection type magnetooptic shown in FIG. 1. Then, the magnetooptic sensor head was placed in a magnetooptic field applying apparatus (MAGNET manufactured by Magnetic). A light signal of a wavelength of 0.786 μm was output from a light source (Semiconductor laser, Model LT024MD/PD SEMI-CONDUCTOR LASER manufactured by Sharp). The light was transmitted through the lens 2, half mirror 3, light inputting/outputting path (optical fiber) 23, polarizer 20, and Faraday rotator 21 to the reflection film 22, and was then reflected back by the reflecting film 22 through the Faraday rotator 21, polarizer 20, and light inputting/outputting (optical fiber) 23 to the half mirror 3 which directs the light to a photodetector 8 (trade name is Model AQ-111 POWER METER, manufactured by Ando Electric Ltd.), which in turn measures the intensity of the light incident thereupon. The Faraday rotator was magnetically saturated when applied with a magnetic field of 1000 Oe. The difference in light intensity between when the Faraday rotator is applied with a magnetic field of 1000 Oe and when not applied, was 2.5 dB.

EXAMPLE 2

A (111) bismuth-substituted iron garnet single crystal film was manufactured in the same way as in Example 1 except that the garnet single crystal (ingot) was out in such as way that [111] axis of the ingot makes an angle of 20 degrees with an axis normal to the surface of the single crystal film. The film thickness was 47 μm and Faraday rotation Θ$_F$ was 42.6 degrees at a wavelength of 786 nm with the Faraday rotator being magnetically saturated.

A magnetooptic sensor head was assembled in the same way as in Example 1 except that the thus manufactured bismuth-substituted iron garnet single crystal film was used. The difference in intensity was 5.0 dB when measured in the same way as in Example 1.

EXAMPLE 3

A (111) bismuth-substituted iron garnet single crystal film was manufactured in the same way as in Example 1 except that the garnet single crystal (ingot) was cut in such as way that [111] axis of the ingot makes an angle of 30 degrees with an axis normal to the surface of the single crystal film. The film thickness of thus manufactured was 44 μm and the Faraday rotation Θ$_F$ was 40.3 degrees at a wavelength of 786 nm with the Faraday rotator being magnetically saturated.

A magnetooptic sensor head was assembled in the same way as in Example 1 except that the thus manufactured (111) bismuth-substituted iron garnet single crystal film was used. The difference in intensity was 8.2 dB when measured in the same way as in Example 1.

EXAMPLE 4

The magnetooptic sensor head used in Example 1 was mounted to the input port of an optical branching device (Model 200S-D2, optical fiber-having a core diameter of 200 μm, manufactured by Mitsubishi Gasu Kagaku) in the form of a polymer optical wave guide. A semiconductor laser light source (Model KLD-780, manufactured by Kette System Service, stabilized LD light source with a wavelength of 0.786 μm) was connected to the output port of the optical branching device. A photodetector (trade name is POWER METER, Model AQ-111, manufactured by Ando Electric) was connected to the light branching port (Y-branching, optical fiber) of the optical branching device. The magnetooptic sensor head was placed in position within a magnetic-field-applying apparatus (Trade name is MAGNET, manufactured by Magnetic).

For various magnetic fields applied to the magnetooptic sensor head, the light intensity of a single light entering the photodetector 35 was measured at a wavelength of 0.783 μm. The difference in light intensity between when the Faraday rotator is applied with a magnetic field of 10000 Oe and when not applied, was 2.3 dB.

EXAMPLE 5

Measurement was made with the same construction as Example 4 except that the magnetooptic sensor head of Example 2 was used in place of the magnetooptic sensor head of Example 1. The difference in light intensity was 7.1 dB.

EXAMPLE 6

Measurement was with the same construction as Example 4 except that the magnetooptic sensor head of Example 3 was used in place of the magnetooptic sensor head of Example 1. The difference in light intensity was 7.7 dB.

EXAMPLE 7

Measurement was made with the same construction as Example 4 except that Model HK-5105 LED stabilized light source having a wavelength of 0.85 μm, manufactured by Shimazu Seisakusho, was used in place of the semiconductor laser light source of a wavelength of 0.783 μm (manufactured by Kette System Service) used in Example 5. The difference in light intensity was 3.8 dB.

EXAMPLE 8

A 500 milliliter platinum crucible was placed on an LPE furnace, which platinum crucible contained therein a lead oxide (PbO, 4N) of 843 grams, a bismuth oxide ($Bi_2O_3$, 4N) of 978 grams, a ferric oxide ($Fe_2O_3$, 4N) of 128 grams, a boron oxide ($B_2O_3$, 5N) of 38 grams, a europium oxide ($Eu_2O_3$, 3N) of 4.2 grams, and a holmium oxide ($Ho_2O_3$, 3N) of 9.0 grams. The content of the crucible was heated to a temperature of 1000 degrees so that the content in the crucible melted. The melted content was sufficiently beaten for a homogeneous mixture and was then cooled down to a melt temperature of 766 degrees, thus preparing a melt for growing a bismuth-substituted iron garnet single crystal.

Then, using a known procedure, a (111) substrate of a garnet single crystal, which has been cut in such as way that [111] axis of the ingot makes an angle of 20 degrees with an axis normal to the surface of the single crystal film, was positioned with one of the two opposed sides thereof being in contact with the thus produced melt for 2.5 hours for epitaxial growth while maintaining the melt temperature at 766 degrees. A crystal obtained was a (111) bismuth-substituted iron garnet single crystal film having a compound of $Ho_{1.1}Eu_{0.6}Bi_{1.3}Fe_5O_{12}$ and a film thickness of 45 μm. This crystal showed a Faraday rotation $\Theta_F$ of 46.1 degrees at a wavelength 783 nm with magnetization saturated at 1200 Oe.

Then, a Faraday rotator was made of the thus produced film. Then, a magnetooptic sensor head based on this Faraday rotator was manufactured as in Example 1.

Measurement was made with the same construction as Example 4 except that a magnetooptic sensor head (Faraday rotator was made of $Ho_{1.1}Eu_{0.6}Bi_{1.3}Fe_5O_{12}$ single crystal) was used in place of the magnetooptic sensor head. The difference in light intensity was 5.8 dB.

EXAMPLE 9

A 500 milliliter platinum crucible was placed on an LPE furnace, which platinum crucible contained therein a lead oxide (PbO, 4N) of 843 grams, a bismuth oxide ($Bi_2O_3$, 4N) of 978 grams, a ferric oxide ($Fe_2O_3$, 4N) of 120 grams, a gallium oxide ($Ga_2O_3$, 4N) of 4.5 grams, a boron oxide ($B_2O_3$, 5N), a gadollium ($Gd_2O_3$, 3N) of 6.5 grams, and an yttrium oxide ($Y_2O_3$, 3N) of 4.0 grams. The content of the crucible was heated to a temperature of 1000 degrees so that the content in the crucible melted. The melted content was sufficiently beaten for a homogeneous mixture and was then cooled down to a melt temperature of 773 degrees to produce a melt for growing a bismuth-substituted iron garnet single crystal.

Then, using a known procedure, a (111) substrate of a garnet single crystal substrate which has been out from an ingot of $(GdCa)_3(GaMgZr)_5O_{12}$ in such a way that [111] axis makes an angle of 20 degrees with an axis normal to the surface of the substrate, was positioned with one of the two opposed sides thereof being in contact with the thus produced melt for 3.0 hours for epitaxial growth while maintaining the melt temperature at 773 degrees. A crystal obtained was a (111) bismuth-substituted iron garnet single crystal having a compound of $Gd_{0.9}Y_{0.9}Bi_{1.2}Fe_{4.8}Ga_{0.2}O_{12}$ and a film thickness of 46 μm. This crystal showed a Faraday rotation $\Theta_F$ of 42.7 degrees at a wavelength of 783 nm with magnetization saturated at 600 Oe.

Then, a Faraday rotator was made of the thus produced film. Then, a magnetooptic sensor head based on this Faraday rotator was manufactured as in Example 1.

Measurement was made with the same construction as Example 4 except that the thus produced magnetooptic sensor head (Faraday rotator is made of single crystal $Gd_{0.9}Y_{0.9}Bi_{1.2}Fe_{4.8}Ga_{0.2}O_{12}$ was used in place of the magnetooptic sensor head of Example 1. The difference in light intensity was 4.5 dB.

Comparison 1

A (111) substrate of a garnet single crystal was manufactured with the same conditions as in Example 1 except that the bismuth-substituted iron garnet single crystal was cut from an ingot in such a way that [111] axis makes an angle of 3 degrees with an axis normal to the surface of the substrate. A crystal obtained was a (111) bismuth-substituted iron garnet single crystal film having a film thickness of 50 μm. This crystal film showed a Faraday rotation $\Theta_F$ of 45.9 degrees at a wavelength of 786 nm with saturated magnetization. Then, a magnetooptic sensor head was manufactured with the same construction as in Example 1 except that the (111) bismuth-substituted iron garnet single crystal of the comparison 1 was used. Measurement was made in the same way as in Example 1, and the difference in light intensity was 1.7 dB.

What is claimed is:

1. A reflection type magnetooptic sensor head where a light inputting/outputting path, polarizer, Faraday rotator, reflecting mirror are aligned in this order, comprising:

a reflecting mirror positioned substantially normal to a light incident thereupon; and a Faraday rotator made of a bismuth-substituted iron garnet single crystal film having (111) axis at an acute angle with an axis normal to a film surface thereof.

2. The reflection type magnetooptic sensor head of claim 1, wherein said polarizer, Faraday rotator, and reflecting mirror are in a unitary construction such that they are in contact with each other.

3. The reflection type magnetooptic sensor head of claim 1 or claim 2, wherein said angle is in the range of 5–60 degrees.

4. The reflection type magnetooptic sensor head of claim 1 or claim 2, wherein said angle is in the range of 10–45 degrees.

* * * * *